(12) United States Patent
Trutna, Jr.

(10) Patent No.: US 6,731,661 B2
(45) Date of Patent: May 4, 2004

(54) TUNING MECHANISM FOR A TUNABLE EXTERNAL-CAVITY LASER

(75) Inventor: William Richard Trutna, Jr., Atherton, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/262,339

(22) Filed: Oct. 1, 2002

(65) Prior Publication Data

US 2004/0062281 A1 Apr. 1, 2004

(51) Int. Cl.$^7$ ................................................. H01S 3/10
(52) U.S. Cl. ............................ 372/20; 372/15; 372/107
(58) Field of Search .............................. 372/20, 15, 107

(56) References Cited

U.S. PATENT DOCUMENTS

| | | | |
|---|---|---|---|
| 5,172,390 A | * 12/1992 | Mooradian | 372/92 |
| 5,319,668 A | * 6/1994 | Luecke | 372/107 |
| 5,802,085 A | 9/1998 | Lefevre et al. | |
| 5,990,473 A | * 11/1999 | Dickey et al. | 250/231.13 |
| 6,026,100 A | * 2/2000 | Maeda | 372/20 |
| 6,304,586 B1 | * 10/2001 | Pease et al. | 372/38.02 |
| 6,469,415 B2 | * 10/2002 | Jerman et al. | 310/309 |
| 6,597,449 B1 | * 7/2003 | Smolka et al. | 356/300 |
| 2001/0036206 A1 | * 11/2001 | Jerman et al. | 372/20 |

* cited by examiner

Primary Examiner—Paul Ip
Assistant Examiner—Dung T Nguyen

(57) ABSTRACT

Systems for tuning external-cavity lasers are provided. A representative system includes a motor and first and second opposing surfaces that are displaceable by the motor. The opposing surfaces operatively engage a support at a drive segment and rotate the drive segment about a pivot point on the support. Between the drive segment and the pivot point of the support, a reflective element is attached. An optical gain medium optically communicates with the reflective element. Other systems are also provided.

14 Claims, 8 Drawing Sheets

US 6,731,661 B2

TUNING MECHANISM FOR A TUNABLE EXTERNAL-CAVITY LASER

FIELD OF THE INVENTION

The present invention generally relates to optics and, more particularly, to systems and methods for mechanically tuning external-cavity lasers.

DESCRIPTION OF THE RELATED ART

Tunable external-cavity lasers are commonly used for numerous applications ranging from spectroscopy to telecommunications. For instance, in a Dense Wavelength Division Multiplexing (DWDM) carrier system that uses multiple lasers, each of which is set to a specific wavelength, a tunable external-cavity laser can be maintained as a spare for multiple ones of the lasers. In such an application, an inventory of spare lasers that are wavelength specific need not be maintained for the DWDM system.

The basic structure of a conventional tunable external-cavity laser primarily includes an anti-reflection (AR) coated optical gain medium placed in an external cavity with a diffraction grating. Interaction between the gain medium and the grating creates feedback of a tunable wavelength. In particular, the diffraction grating within the external cavity forces the gain medium to operate in a single longitudinal mode by creating a wavelength-dependent loss within the external cavity and, thus, enables one or more wavelengths to be selected or tuned. AR coating is applied on the front facet of the gain medium in order to suppress self-lasing between the front and back facets. The AR coating, therefore, prevents the laser from operating in a mode determined by the facets and, thus, the laser operates in a mode determined by the external diffraction grating. On the back facet, a highly reflective coating is used to reflect the light through the front facet, through a collimating lens, and onto the grating, where the first order diffraction beam is directed back onto the optical gain medium. The beam is then amplified and coupled out of the laser as the zero order diffraction beam. Alternatively, the light can be coupled out of the cavity through a partially-transmitting back facet.

Tunable external-cavity lasers typically are considered too large in size and too mechanically sensitive for use in optical networks. As demonstrated in U.S. Pat. No. 5,802,085, issued on Sep. 1, 1998, and shown in FIG. 1, a typical tuning mechanism includes a stepper motor 110, a support 120 with an attached frequency selective reflective element 130, such as a mirror or reflective diffraction grating, and a pushrod 140. In this general type of device, the pushrod 140 converts the rotary motion of the stepper motor 110 into linear motion. Accordingly, the pushrod 140, via the stepper motor 110, drives the support 120 and frequency selective reflective element 130 about a pivot axis P to adjust the orientation of the frequency selective reflective element 130 with respect to the propagation axis of the light emitted from the optical gain medium 105.

As a result of the support being held in place only by a pushrod and possibly a spring, as demonstrated in U.S. Pat. No. 5,319,668, issued on Jun. 7, 1994, the support in these types of tuning mechanisms often moves, e.g., shakes out of position, when subjected to vibration. Such vibration is present in a forced-air cooled equipment rack, for example. Moreover, the rotation angle of the reflective element is not directly proportional to the rotation angle represented by the motor step count, since the pushrod converts the motor's rotary motion to a linear motion. This can make the laser difficult to tune and control. Both U.S. Pat. Nos. 5,802,085 and 5,319,668 are incorporated herein by reference.

Therefore, there is a need for improved systems and methods that address these and/or other perceived shortcomings of the prior art. For example, there is a need in the industry for an improved system and method that provide compact, efficient, and robust mechanical tuning of an external-cavity laser.

SUMMARY OF THE INVENTION

The present invention involves external-cavity laser tuning mechanisms. These tuning mechanisms use opposing drive surfaces to engage the supports upon which reflective elements are attached. This fixes the position of such a reflective element. Repositioning of the reflective element for tuning is accomplished by a motor, the rotation of which is directly proportional to the rotation of the reflective element about its pivot.

In this regard, the present invention provides systems and methods for improved mechanical tuning of an external-cavity laser. Briefly described, one such system includes a motor and first and second opposing surfaces that are displaceable by the motor. The opposing surfaces operatively engage a drive segment of the support and rotate the drive segment about a pivot point on the support. Between the drive segment and the pivot point of the support, a reflective element is attached. An optical gain medium optically communicates with the reflective element.

Other features and/or advantages of the present invention will be or become apparent to one with skill in the art upon examination of the following drawings and detailed description. It is intended that all such additional features and advantages be included within the description, be within the scope of the present invention, and be protected by the accompanying claims.

BRIEF DESCRIPTION OF THE DRAWINGS

The invention can be better understood with reference to the following drawings. The elements of the drawings are not necessarily to scale relative to each other, emphasis instead being placed upon clearly illustrating the principles of the invention. Furthermore, like reference numerals designate corresponding parts throughout the several views.

DETAILED DESCRIPTION

Figure 1:
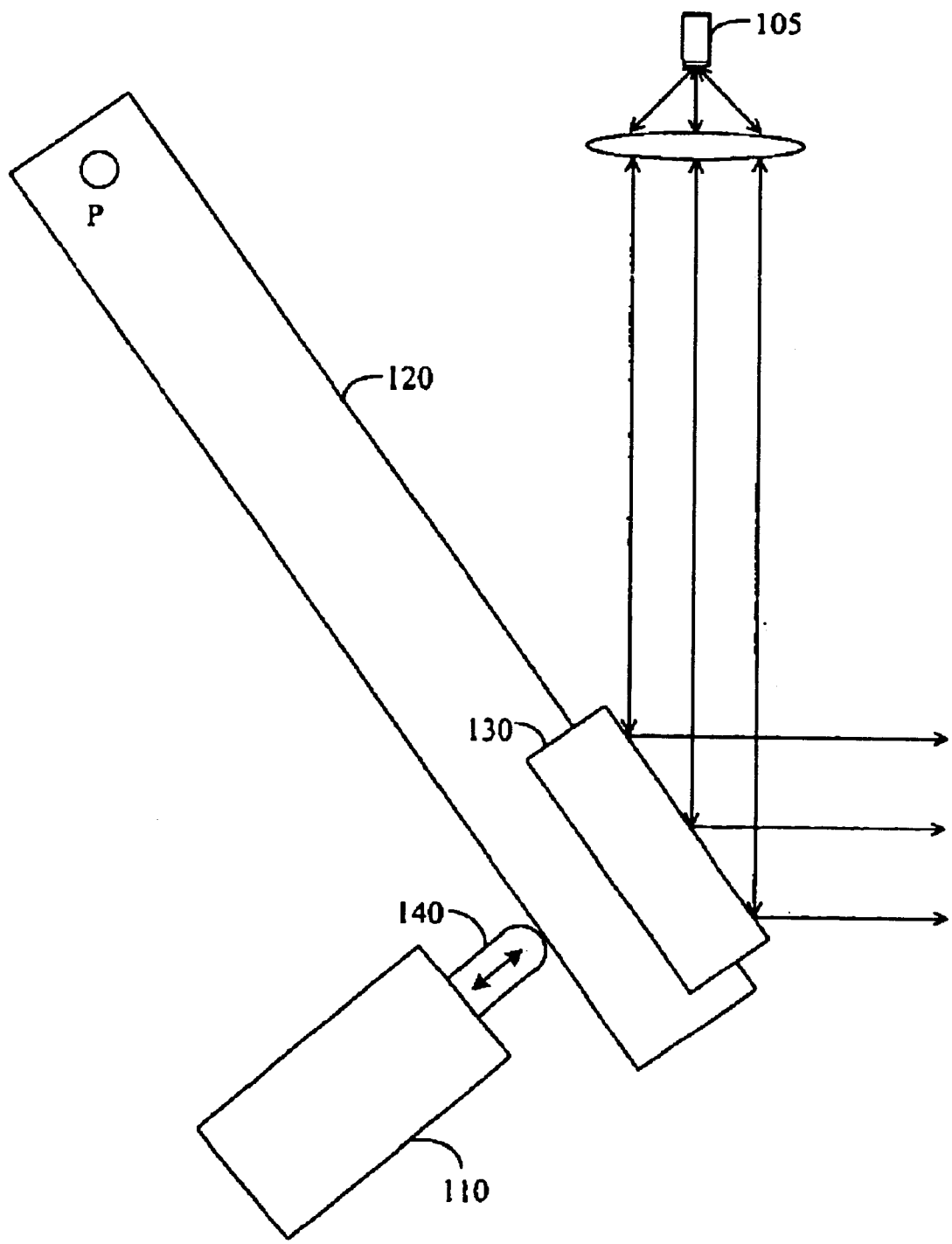
FIG. 1 is a diagram illustrating a mechanism for tuning an external-cavity laser of the prior art.
Figure 2:
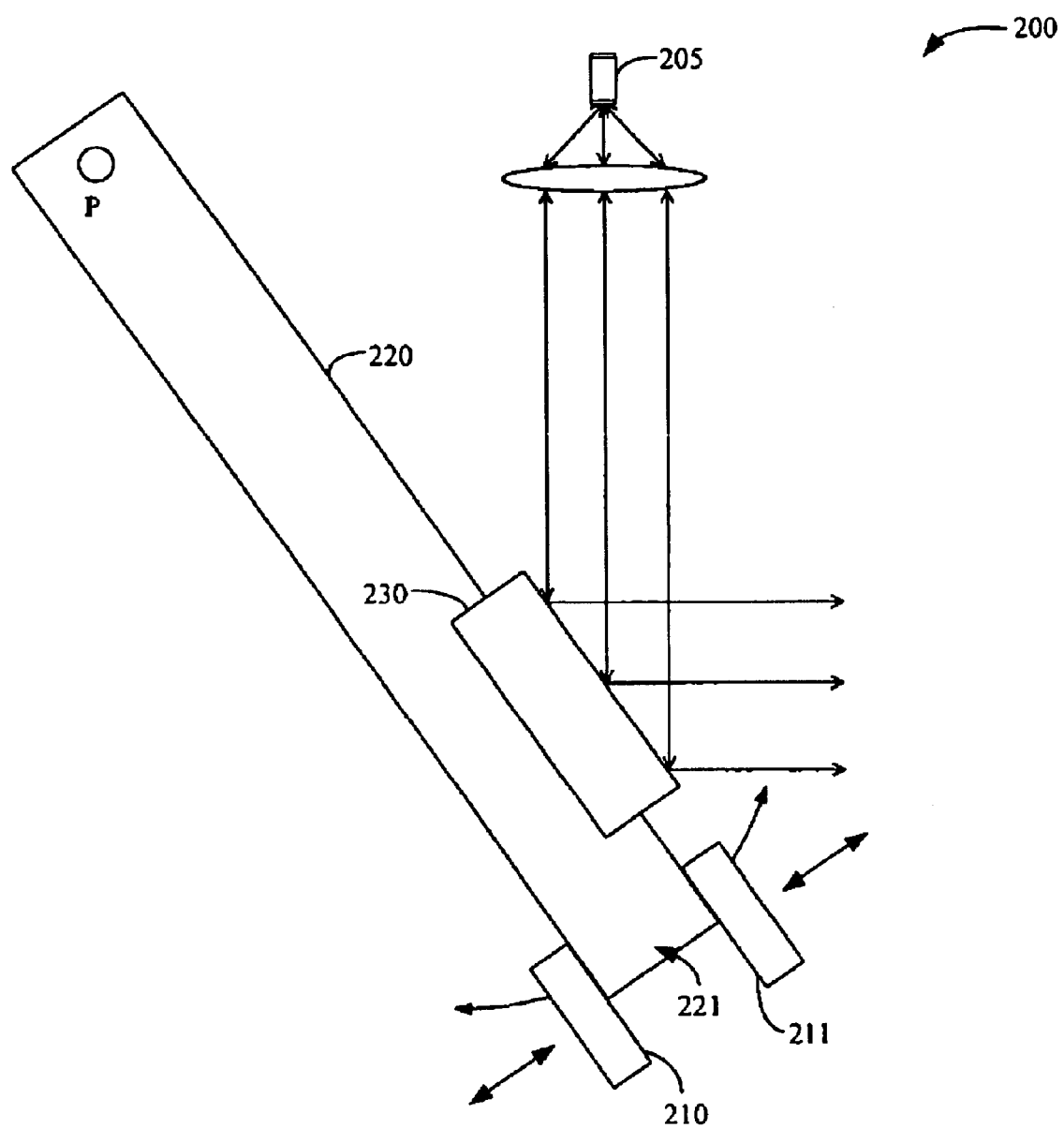
FIG. 2 is a diagram illustrating an embodiment of a system for tuning an external-cavity laser of the present invention.

The present invention includes an improved system for tuning an external-cavity laser. As shown by FIG. 2, the system 200 includes opposing drive surfaces 210, 211 engaging a support 220 at a drive segment 221. The support 220, is rotated about a pivot P by displacement of the opposing drive surfaces 210, 211 such that the support 220 rotates through an arc that is spaced from the pivot P. A frequency selective reflective element 230 is attached to the support between the drive segment 221 and the pivot point P. Although the placement of the frequency selective element 230 with respect to the pivot point P and the drive segment 221 in FIG. 2 corresponds to a second order lever configuration, it is emphasized that the position of the frequency selective element 230 is not limited to a second order configuration. For example, the frequency selective element 230 may also be arranged in first order and third order lever configurations.

In one preferred embodiment of the invention, as shown by FIG. 2, a reflective diffraction grating is used as the frequency selective element 230. An optical gain medium 205 emits a beam of light towards the diffraction grating 230. Therefore, when the support 220 is rotated, the diffraction grating 230 is rotated so that its orientation with respect to the propagation axis of the optical gain medium 205 is changed.

As mentioned previously, tunable external-cavity lasers have not been deployed in some applications because of their large size. For instance, Littrow and the Littman-Metcalf designs both require the projection of light diffracted by a grating over a distance. Therefore, mechanical implementations of these designs have tended to be bulky and mechanically unstable. Embodiments of the invention can alleviate these shortcomings.

Figure 3:
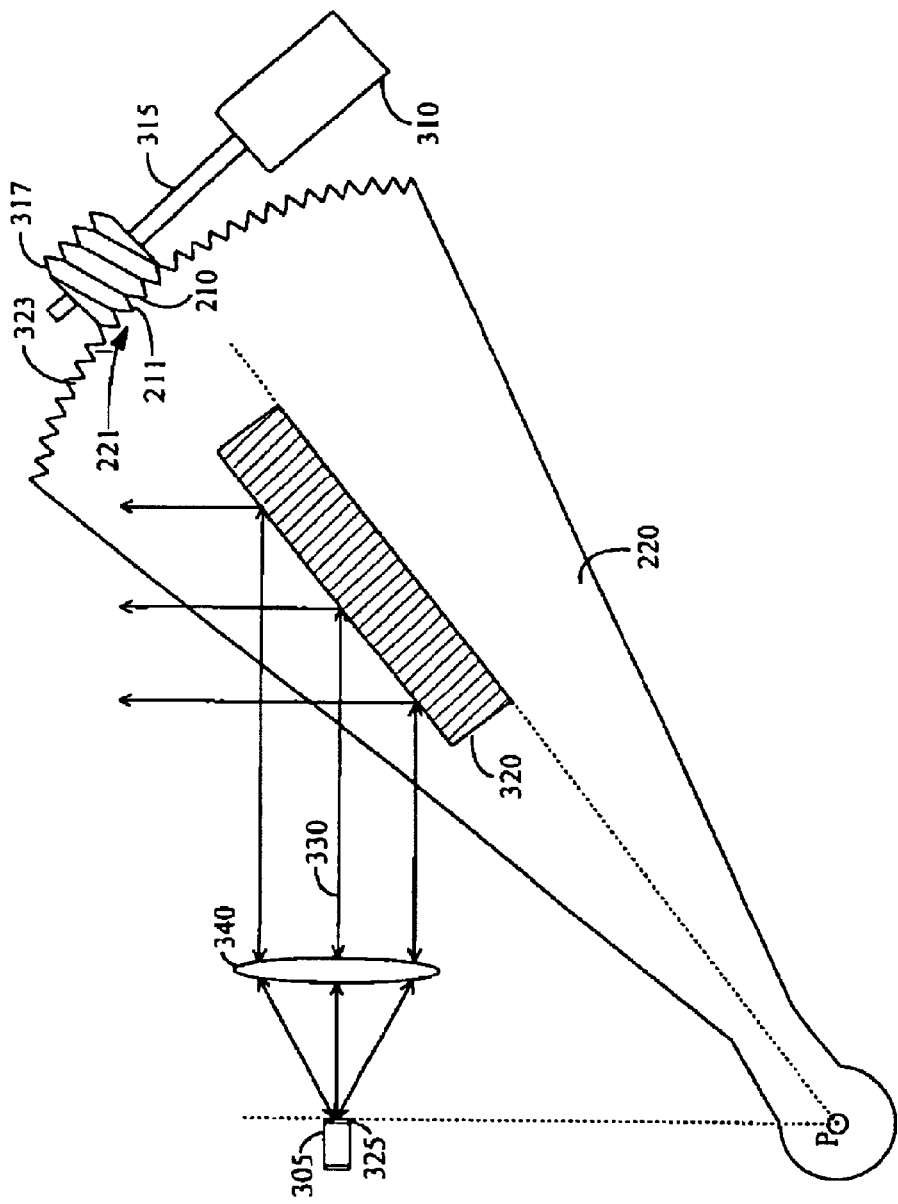
FIG. 3 is a diagram illustrating an embodiment of a system for tuning an external-cavity laser of FIG. 2, based on the Littrow external-cavity design.

In this regard, an embodiment of the present invention for tuning an external-cavity laser that employs a Littrow design is depicted in FIG. 3. A shown in FIG. 3, the system 300 includes an optical gain medium 305. The optical gain medium 305 is a semiconductor diode that has a facet 325 coated with anti-reflection coating. A collimating lens 340 is positioned in front of the facet 325. A motor 310 with an attached shaft 315 carries the opposing drive surfaces 210, 211 that engage the drive segment 221 of the support. The motor 310 may be any motor that can provide precise motor control, such as a stepper motor, servo motor, etc. In FIG. 3, the drive surfaces 210, 211 are opposed surfaces of a worm gear 317 that is attached to and rotated by shaft 315. The drive surfaces 210, 211 engage the support 220 at a drive segment 221 located on the support. In this particular embodiment, the drive segment 221 is located at the end of the support and has teeth 323, at least one of which engages between surfaces 210 and 211. A second end of the support 220 is fixed at a pivot P. Between the drive segment 221 and the pivot point P, a frequency selective reflective element 320 is attached to the support 220. In this particular embodiment, the frequency selective reflective element 320 is a reflective diffraction grating. The position of the reflective diffraction grating 320 is not limited to the second order lever configuration shown in FIG. 3. Other embodiments of the invention may vary the positioning of the frequency selective reflective element 320 with respect to the pivot point P and the drive segment 221.

In operation, the motor 3 10 turns the drive surfaces 210, 211. The drive surfaces 210, 211 engage and drive the teeth 323 of the drive segment 221. As the motor drives the drive segment 221 around pivot P, the reflective diffraction grating 320 is rotated through an arc spaced from pivot P. Therefore, the orientation of the reflective diffraction grating 320 with respect to the propagation axis of the optical gain medium 305 is changed. Note, the rotation angle of the support 220 and the reflective diffraction grating 320 is directly proportional to the rotation angle of the drive surfaces 210, 211. This makes the device easier to control. In some embodiments of the invention, control circuitry, such as a digital computer, among others, can be used to control the exact rotational positioning of the motor and, hence, the rotational position of the reflective diffraction grating 320.

Figure 4:
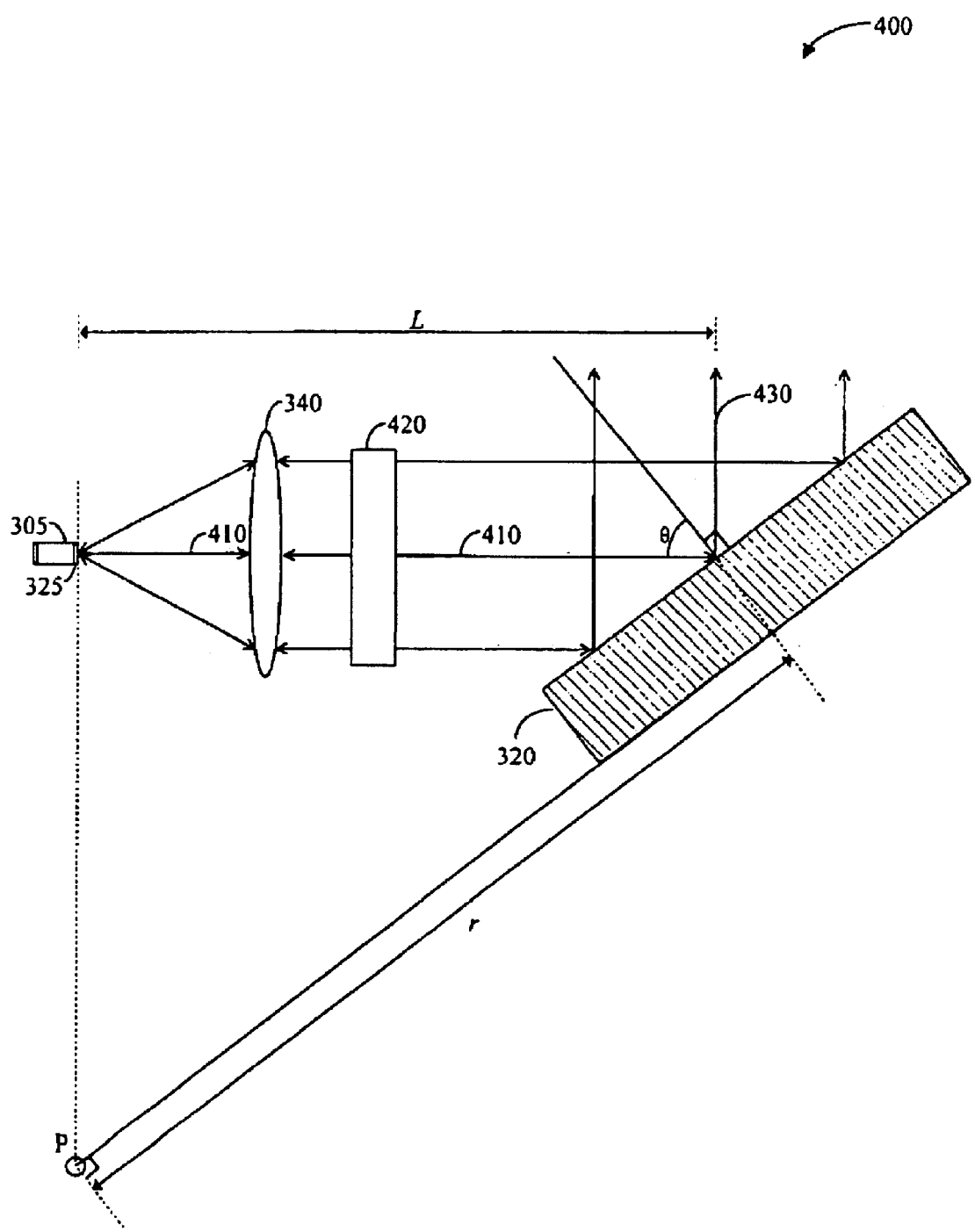
FIG. 4 is a diagram illustrating the embodiment of the system for tuning an external-cavity laser of FIG. 3.

For the Littrow configuration 400, as shown by FIG. 4, a first order diffraction beam 410 is diffracted back at an angle equal to the angle of incidence. Therefore, by mechanically rotating the reflective diffraction grating 320, the output laser beam can be tuned to a discrete wavelength. Tuning is achieved by controlling the incidence angle $\theta$ of the laser beam with respect to the reflective diffraction grating 320. In addition, an optical filter 420, such as an etalon, can be used to further decrease the cavity bandwidth in pursuit of single mode operation.

To obtain a spectrally narrow single longitudinal mode, the output beam 430 is made to reflect off the grating 320 (zeroth order diffraction), while the first order beam diffracts back into the optical gain medium 305. If the incidence angle $\theta$ is such that the first order diffraction counterpropagates the laser output 410, the following equation is satisfied:

$$\lambda = 2d \sin \theta \qquad \text{Equation 1}$$

where d is the pitch of the grating 320 and $\lambda$ is the wavelength of the first order diffraction beam 410. Therefore, in a mechanical implementation of the Littrow configuration, as shown by FIG. 4, incidence angle $\theta$ selects the output wavelength $\lambda$ of the laser, where the reflective diffraction grating 320 acts as a frequency-selective output coupler. Alternatively, the laser output can be coupled from a partially-transmitting back facet. This may be beneficial, since the zero order diffraction reflection 430 changes in angle as the laser is tuned.

To prevent mode hopping of the laser during rotation of the diffraction grating 320, an appropriate position of pivot point P is selected. The wavelength of the laser $\lambda$ is characterized by two constraints: the cavity length L of the laser and the incidence angle $\theta$ at which the light beam intersects the grating (as described by Equation 1).

The laser cavity length L defines a discrete set of possible wavelengths or modes, $\lambda_N$, that can lase, given by the equation:

$$L = N \frac{\lambda_N}{2} \qquad \text{Equation 2}$$

where N is the integral number of modes in the laser cavity. For continuous tuning, the mode number N should be a constant value irrespective of the value of wavelength $\lambda_N$.

From the geometry of FIG. 4, it can also be shown that $$L = r \sin \theta \qquad \text{Equation 3}$$

Therefore, from Equation 2 and Equation 3, the mode number is $$N = \frac{2r \sin \theta}{\lambda_N} \qquad \text{Equation 4}$$

If λ, as defined in Equation 1, is substituted for $\lambda_N$ in Equation 4, then $$N = \frac{r}{d} \qquad \text{Equation 5}$$

which results in a constant mode number N irrespective the wavelength λ. Accordingly, a pivot point P that satisfies Equation 1 and Equation 2 will provide continuous tuning without mode hopping, since the optical gain medium 305 will only oscillate at a constant mode number N.

Figure 5:
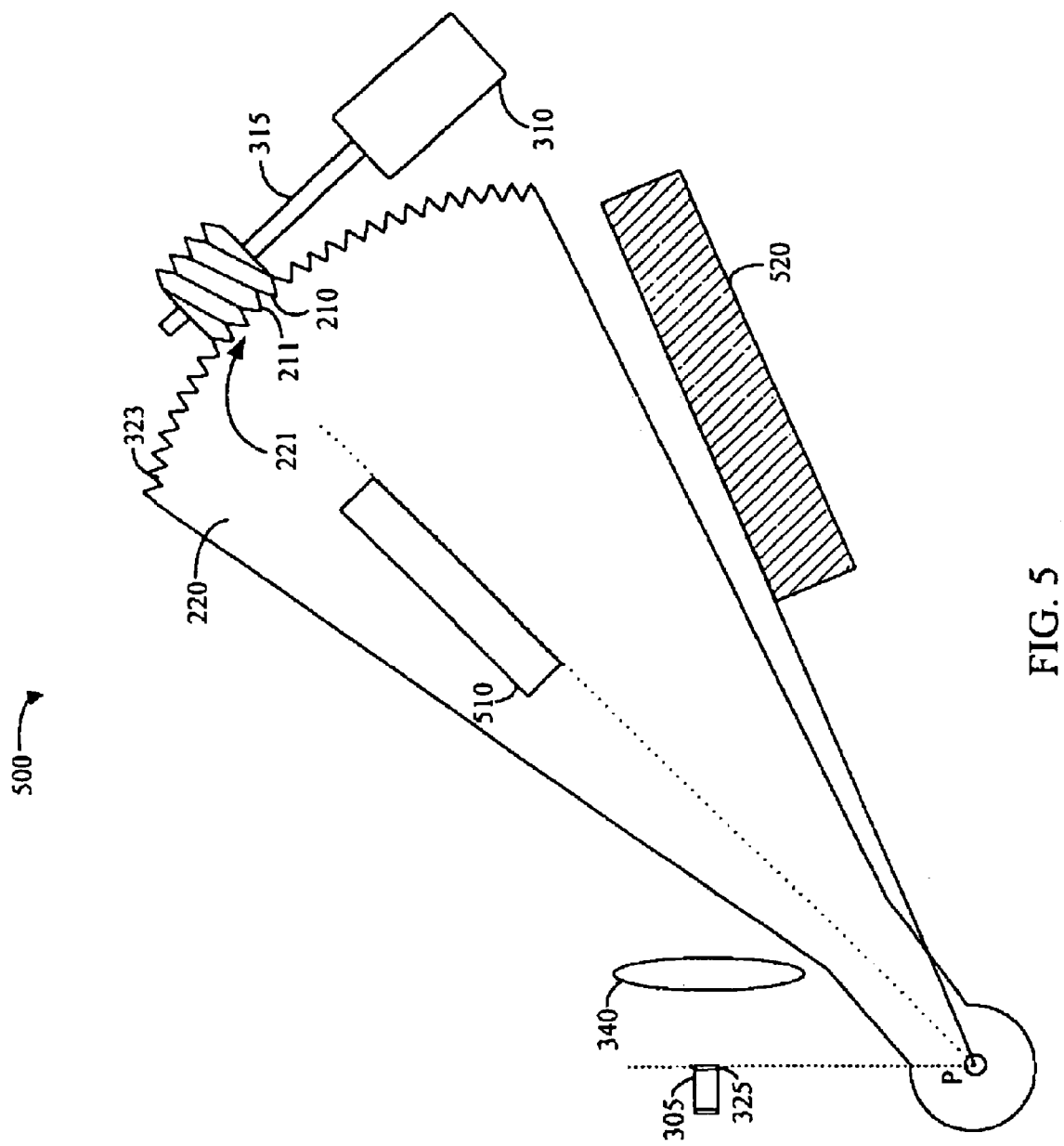
FIG. 5 is a diagram illustrating an embodiment of a system for tuning an external-cavity laser of FIG. 2, based on the Littman-Metcalf external-cavity design.

An alternative and more common tuning mechanism design for an external-cavity laser is the Littman-Metcalf design. One embodiment of the invention for tuning an external-cavity laser that employs a Littman-Metcalf design is depicted in FIG. 5. As shown in FIG. 5, the tuning system 500 is similar to the tuning system 300 of FIG. 3 except for the reflective diffraction grating 320 being replaced with a frequency selective reflective element 510 that is a mirror or retroflector. Further, a reflective diffraction grating 520 is statically mounted to optically communicate with the retroflector 510 and the optical gain medium 305.

Figure 6:
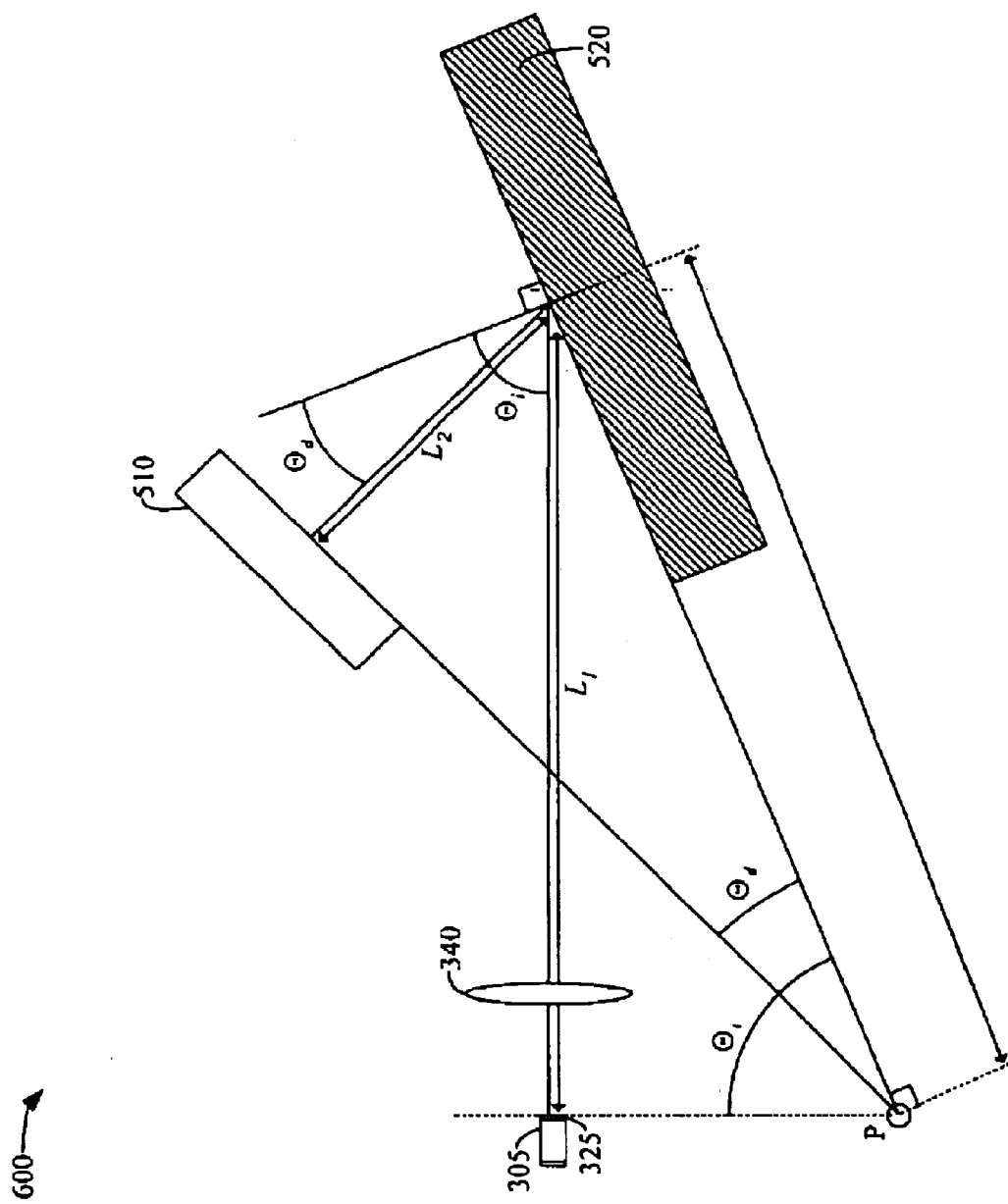
FIG. 6 is diagram illustrating the embodiment of a system for tuning an external-cavity laser of FIG. 5

The operation of the Littman-Metcalf external-cavity laser is depicted in FIG. 6. In a Littman-Metcalf design 600 of FIG. 6, the reflective diffraction grating 520 receives light from the optical gain medium 305 and diffracts this light towards the retroflector 510. The retroflector 510 reflects this light back towards the grating 520. At one particular wavelength, the retroflector 510 reflects the light such that the light reflects off the reflective diffraction grating 520 at an angle at which the light returns to the optical gain medium 305. By rotating the retroflector 510 about the pivot point P, the wavelength of the light reflected back to the optical gain medium 305 is changed.

Continuous tuning of the wavelength that is returned to the optical gain medium 305 requires that the external cavity length be a constant integer number N of half wavelengths over the entire tuning range, where the integer N is the cavity mode number. As shown in FIG. 6, pivot point P is the point about which the frequency selective reflective element 510 rotates. However, as a practical matter, the offset between the pivot point P and the point where light is incident on the retroflector 510 is typically refined by trial and error adjustments due to uncertainties in the size and the index of refraction of the optical gain medium 305.

Referring again to FIG. 6, the following relationships can be derived:

$$L_1 = r \sin(\Theta_i) \qquad \text{Equation 6}$$

$$L_2 = r \sin(\Theta_d) \qquad \text{Equation 7}$$

where $L_1$ is the physical distance between the front facet 325 and the reflective diffraction grating 520, $L_2$ is the physical distance from the reflective diffraction grating 520 and the retroflector 510, $\Theta_i$ is the incidence angle, and $\Theta_d$ is the diffraction angle.

$\Theta_d$ can also be calculated from the grating equation, $$\frac{\lambda}{d} = \sin(\Theta_i) + \sin(\Theta_d) \qquad \text{Equation 8}$$

where λ is a wavelength of light, d is the grating pitch, $\Theta_i$ is the incidence angle, and $\Theta_d$ is the diffraction angle.

The optical cavity length is $L_1+L_2$, which after substituting Equations 6 and 7 into Equation 8 becomes $$L_1 + L_2 = \left(\frac{2r}{d}\right)\frac{\lambda}{2} \qquad \text{Equation 9}$$

Therefore from Equation 9, it is shown that the cavity mode number is 2r/d, which is a constant, independent of the diffraction angle $\Theta_d$ and the laser wavelength λ.

Referring back to FIG. 5, the position of pivot P and the mounting point of the mirror 510 at an offset distance from P onto the support 220 are set so that Equation 9 is satisfied. In particular, P is positioned so that the axis of rotation of the mirror 510 causes a change in the cavity length 2L/d that exactly tracks the change in wavelength λ, thereby preventing mode hops.

Figure 7:
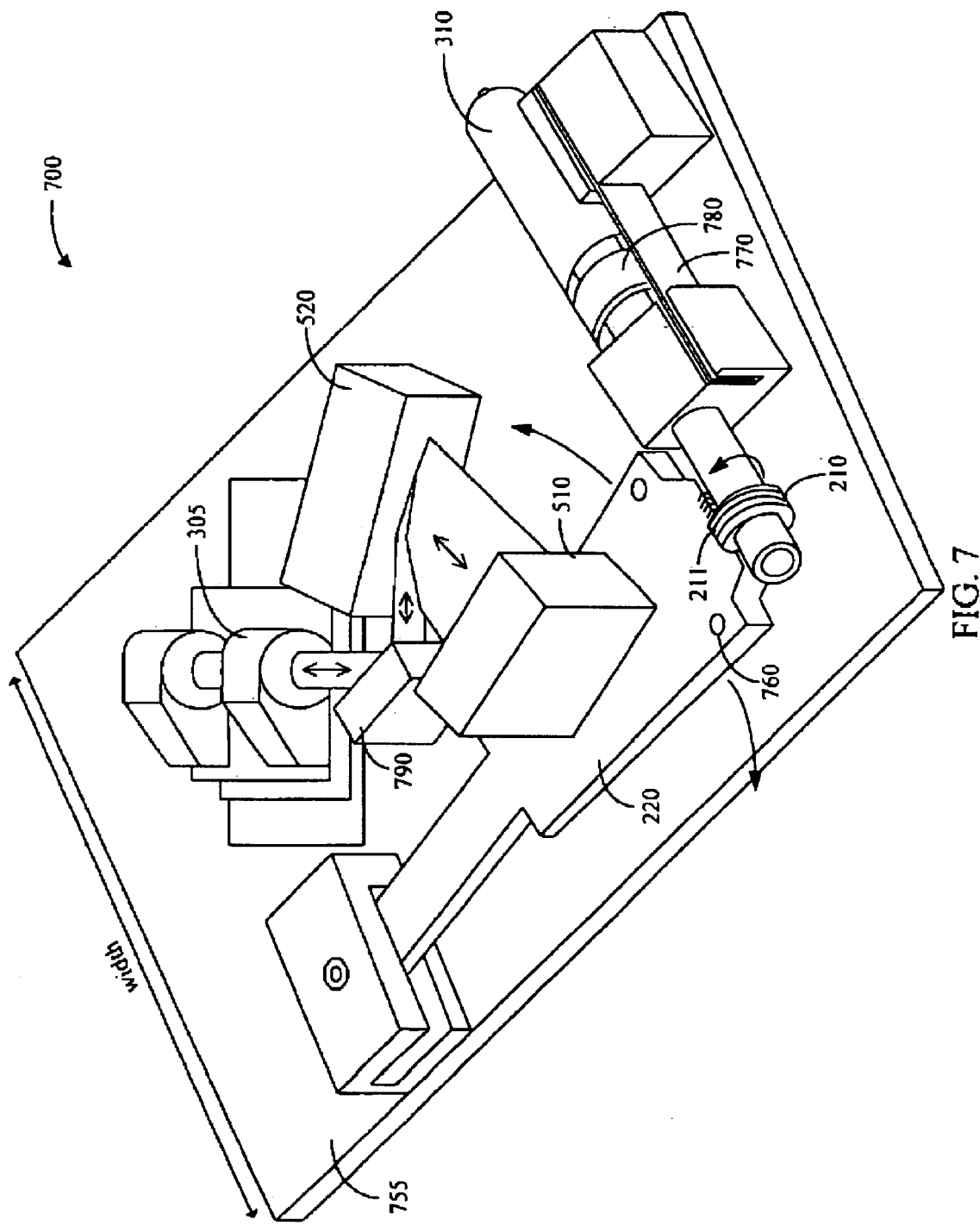
FIG. 7 is a detailed diagram illustrating an embodiment of a system for tuning an external-cavity laser of FIG. 5.

A more detailed implementation of a system for tuning an external-cavity laser is shown in FIG. 7. In this implementation, the tuning mechanism is based on a Littman-Metcalf external-cavity configuration. However, a person of ordinary skill in the art should understand that the system 700 may be implemented on other external-cavity designs. Here, a support 220 is supported on a base plate 755 (which may be ceramic) by ball bearings which are set in cavities 760 of the support. An anti-backlash spring 770 supports a motor 310 and gearbox 780. Since the support 220 is held rigidly in place by the opposing drive surfaces 210, 211, the support 220 and the attached mirror 510 resist being knocked out of alignment. An additional mirror 790 is used to fold the transmission path of a laser beam between the laser source 305 and the reflective diffraction grating 520 so that the transmission path of the laser beam is confined within a small area. Therefore, the tuning system 700 can be compactly arranged to have a width that is not greater than 40 mm.

Figure 8:
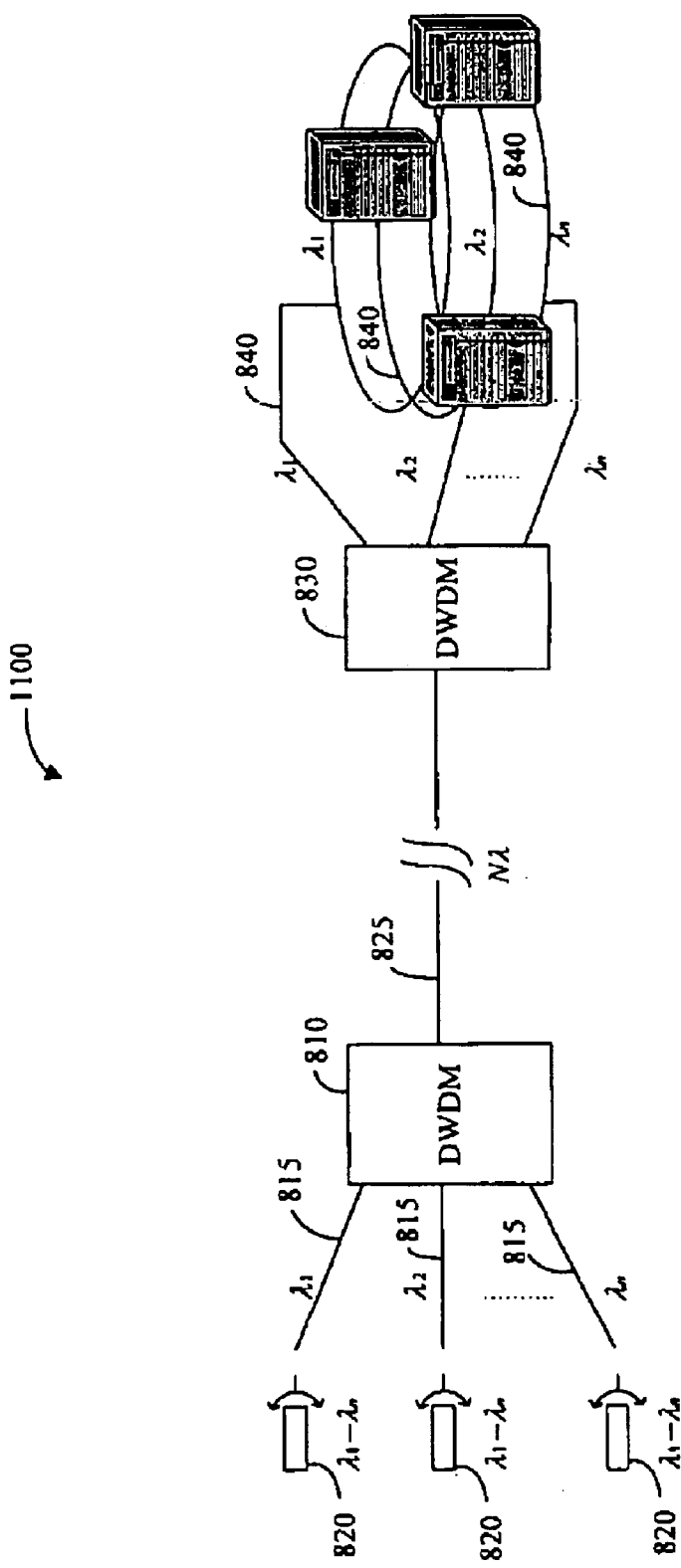
FIG. 8 is a diagram illustrating a DWDM system utilizing an embodiment of a system for tuning an external-cavity laser of the invention.

As shown by FIG. 8, a tuning system of the invention can be used in an optical system 800 that uses a wavelength multiplexer 810. The multiplexer 810 combines beams of discrete wavelengths 815 from tunable external-cavity lasers 820 of the present invention into a light beam constituting multiple wavelengths or channels of light. The beam of multiple wavelengths of light is transmitted over an optical medium 825 to a de-multiplexer 830. The de-multiplexer 830 separates the multiple channels of light from the beam 825 into a plurality of light beams 840, each having a discrete wavelength of light.

Advantageously, in each of the previous embodiments, the support for the frequency selective reflective element is held rigidly in place by the opposing surfaces. Further, the rotation angle of the support and the frequency selective reflective element is directly proportional to the rotation angle of the shaft of the motor, which makes the device easier to control. For instance, if the motor is a stepper motor, then the rotation angle of the first frequency selective reflective element is proportional to the step count of the stepper motor. Moreover, some embodiments of the present invention can be more compact than previous mechanical implementations of external-cavity laser configurations.

It should be emphasized that the above-described embodiments of the present invention, are merely possible examples of implementations, merely set forth for a clear understanding of the principles of the invention. Many variations and modifications may be made to the above-described embodiments of the invention without departing substantially from the principles of the invention.

For example, it is contemplated that other external-cavity configurations may be implemented using the tuning system, and it is also contemplated that other implementations besides the ones shown of the Littrow and Littman-Metcalf configurations may be designed using the invention. For instance, the reflective diffraction grating for the Littrow-Metcalf configuration could be mounted on the support instead of the mirror and the geometric requirements of Equation 9 could still be satisfied. Further, other mounting elements besides a reflective diffraction grating or mirror could be positioned on the support. It is also contemplated that the support may not need to be upheld by a base plate. In addition, implementations of the tuning system on double-sided configurations of external cavities, where the output laser beam exits out a second or back facet of the diode chip into an output fiber, are contemplated.

Therefore, it will be understood by those skilled in the art that the present invention is not limited to the specific implementations shown in the figures. All such modifications and variations are intended to be included herein within the scope of the disclosure and the present invention and protected by the following claims.

What is claimed is:

1. An optical system for tuning a laser beam, said system comprising:
    a support including a pivot point and a drive segment laterally offset from the pivot point, the drive segment comprising a curved outer portion defined by a substantially continuous radius from the pivot point and teeth located along and extending outwardly from the curved outer portion;
    a worm gear having first and second opposing drive surfaces, the first and second opposing drive surfaces operatively engaging the teeth of the drive segment to rotate the drive segment about the pivot point through an arc defined by the curved outer portion of the drive segment; and
    a first reflective element supported by the support.

2. The system of claim 1, further comprising:
    a motor coupled to the first and second drive surfaces, the motor operating to move the first and second drive surfaces.

3. The optical system of claim 2, wherein the motor is a stepper motor.

4. The optical system of claim 2, wherein the motor is a servo motor.

5. The optical system of claim 2, further comprising:
    control circuitry communicating with the motor for controlling rotation of the motor and the first and second drive surfaces.

6. The optical system of claim 1, further comprising:
    an optical gain medium optically communicating with the first reflective element for emitting light towards the first reflective element.

7. The optical system of claim 6, wherein the optical gain medium includes a light emitting diode that emits light towards the first reflective element.

8. The optical system of claim 7, wherein the optical gain medium has first and second facets, the first facet coated with anti-reflection coating, and the second facet coated with highly reflective coating.

9. The optical system of claim 6, further comprising:
    a collimating lens positioned between the optical gain medium and the first reflective element.

10. The optical system of claim 9, further comprising:
    an etalon positioned between the collimating lens and the first reflective element.

11. The optical system of claim 1, wherein the first reflective element includes a reflective diffraction grating.

12. The optical system of claim 1, further comprising:
    a second reflective element positioned to reflect light towards the first reflective element, wherein the second reflective element is a reflective diffraction grating and the first reflective element is a retroreflector with respect to the reflective diffraction grating.

13. The optical system of claim 1, further comprising a motor and a shaft, the shaft being connected to the worm gear such that a rotation angle of the support is directly proportional to a rotation angle of the shaft.

14. The optical system of claim 13, wherein the motor is a stepper motor, and wherein the rotation angle of the support is directly proportional to a step count of the stepper motor.

* * * * *